(12) United States Patent
Lee

(10) Patent No.: US 9,778,498 B2
(45) Date of Patent: Oct. 3, 2017

(54) DISPLAY DEVICE

(71) Applicant: SAMSUNG DISPLAY CO., LTD., Yongin-si, Gyeonggi-Do (KR)

(72) Inventor: Hee-Kwon Lee, Asan-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 3 days.

(21) Appl. No.: 14/840,180

(22) Filed: Aug. 31, 2015

(65) Prior Publication Data
US 2016/0239132 A1    Aug. 18, 2016

(30) Foreign Application Priority Data

Feb. 13, 2015 (KR) .................. 10-2015-0022411

(51) Int. Cl.
| G06F 3/041 | (2006.01) |
|---|---|
| G02F 1/1333 | (2006.01) |
| G06F 1/16 | (2006.01) |
| G06F 3/044 | (2006.01) |
| H01L 51/00 | (2006.01) |
| H01L 51/52 | (2006.01) |

(52) U.S. Cl.
CPC ...... *G02F 1/133305* (2013.01); *G06F 1/1652* (2013.01); *G06F 3/044* (2013.01); *G02F 1/13338* (2013.01); *G06F 2203/04102* (2013.01); *H01L 51/0097* (2013.01); *H01L 51/524* (2013.01)

(58) Field of Classification Search
CPC ....... A63B 2071/0663; G02F 1/133305; G02F 1/13338; G06F 1/163; G06F 1/1652; G06F 3/044; G06F 2203/04102; H01L 51/0097; H01L 51/524
See application file for complete search history.

(56) References Cited

U.S. PATENT DOCUMENTS

| 4,191,725 A | * | 3/1980 | Armstrong ............ H01J 29/896 264/261 |
|---|---|---|---|
| 5,153,816 A | * | 10/1992 | Griffin ..................... H02G 3/14 174/66 |
| 6,208,399 B1 | * | 3/2001 | Ohta .................. G02F 1/134363 349/139 |
| 6,632,113 B1 | * | 10/2003 | Noma ..................... B03B 9/062 445/2 |
| 2002/0097195 A1 | * | 7/2002 | Frank ..................... G09F 23/00 345/5 |
| 2006/0166790 A1 | * | 7/2006 | Wang ................. A63B 24/0062 482/8 |

(Continued)

FOREIGN PATENT DOCUMENTS

| KR | 10-0500269 B1 | 7/2005 |
|---|---|---|
| KR | 10-2011-0051612 A | 5/2011 |

(Continued)

*Primary Examiner* — Michael J Eurice
(74) *Attorney, Agent, or Firm* — Lee & Morse P.C.

(57) ABSTRACT

A display device, including a flexible display; and a curved window adjacent to one surface of the flexible display, the curved window having a predetermined curvature, the curved window having a recess groove formed in a surface thereof that the flexible display contacts, and at least a portion of a part of the flexible display contacting the curved window being in the recess groove.

8 Claims, 8 Drawing Sheets

(56) References Cited

U.S. PATENT DOCUMENTS

| | | | | |
|---|---|---|---|---|
| 2009/0138636 A1* | 5/2009 | Burton | .................. | A63B 24/00 |
| | | | | 710/63 |
| 2010/0013785 A1* | 1/2010 | Murai | ..................... | G06F 3/047 |
| | | | | 345/173 |
| 2010/0039398 A1* | 2/2010 | Lin | ......................... | G06F 3/041 |
| | | | | 345/173 |
| 2011/0215934 A1* | 9/2011 | Boyd | ................ | A63B 24/0062 |
| | | | | 340/573.1 |
| 2012/0329525 A1* | 12/2012 | Hashimoto | ............. | C03C 15/00 |
| | | | | 455/566 |
| 2013/0106603 A1* | 5/2013 | Weast | .................... | G06F 1/163 |
| | | | | 340/539.11 |
| 2014/0043569 A1* | 2/2014 | Yabuta | ................ | G02F 1/13338 |
| | | | | 349/104 |
| 2016/0190055 A1* | 6/2016 | Jinbo | ................. | H01L 27/3276 |
| | | | | 257/99 |

FOREIGN PATENT DOCUMENTS

KR  10-2011-0088979 A  8/2011
KR  10-2014-0117960 A  10/2014

\* cited by examiner

DISPLAY DEVICE

CROSS-REFERENCE TO RELATED APPLICATION

Korean Patent Application No. 10-2015-0022411, filed on Feb. 13, 2015, in the Korean Intellectual Property Office, and entitled: "Display Device," is incorporated by reference herein in its entirety.

BACKGROUND

1. Field

This disclosure relates to a display device.

2. Description of the Related Art

In accordance with the development of information oriented societies, a demand for a display device for displaying an image may increase in various forms. The display device as described above may be mounted in various portable terminals. In accordance with a demand of a user that may want to conveniently carry the terminal, the terminal may be a wearable portable terminal.

SUMMARY

Embodiments may be realized by providing a display device, including a flexible display; and a curved window adjacent to one surface of the flexible display, the curved window having a predetermined curvature, the curved window having a recess groove formed in a surface thereof that the flexible display contacts, and at least a portion of a part of the flexible display contacting the curved window being in the recess groove.

The flexible display may include a substrate; a polarizing plate on the substrate; and a touch sensor on the polarizing plate, the touch sensor being in the recess groove of the curved window.

The polarizing plate may be in the recess groove of the curved window.

The recess groove may have a shape corresponding to that of the touch sensor.

Embodiments may be realized by providing a display device including a flexible display including a display area and a non-display area; and a curved window adjacent to one surface of the flexible display, the curved window having a predetermined curvature, the curved window including a light blocking layer at a portion corresponding to the non-display area on a surface thereof contacting the flexible display, the light blocking layer including a pattern part having a plurality of holes in a pattern in an end portion of the light blocking layer adjacent to the display area.

The pattern part may be along a portion of the curved window corresponding to a boundary between the display area and the non-display area.

The holes in the pattern part may have a polygonal shape, a circular shape, or a line shape.

BRIEF DESCRIPTION OF THE DRAWINGS

Features will become apparent to those of skill in the art by describing in detail exemplary embodiments with reference to the attached drawings in which:

FIG. 7 illustrates a view of a light blocking layer in which circular holes are formed; and FIG. 8 illustrates a view of a light blocking layer in which quadrangular holes are formed.

DETAILED DESCRIPTION

Figure 1:
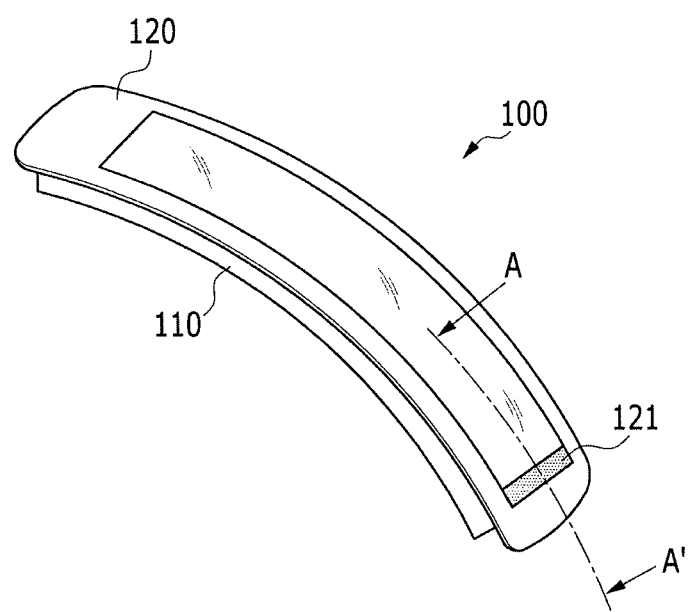
FIG. 1 illustrates a perspective view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Portions unrelated to the description will be omitted in order to obviously describe embodiments, and similar components will be denoted by the same reference numerals throughout the present specification.

In addition, in several exemplary embodiments, components having the same configuration will be representatively described using the same reference numerals in an exemplary embodiment, and only components different from those of an exemplary embodiment will be described in the other exemplary embodiments.

Throughout the present specification, when any one part is referred to as being "connected to" another part, it means that any one part and another part are "directly connected to" each other or are "indirectly connected to" each other with the other part interposed therebetween. In addition, throughout the present specification, unless explicitly described to the contrary, the word "comprise" and variations such as "comprises" or "comprising" will be understood to imply the inclusion of stated elements but not the exclusion of any other elements.

Figure 2:
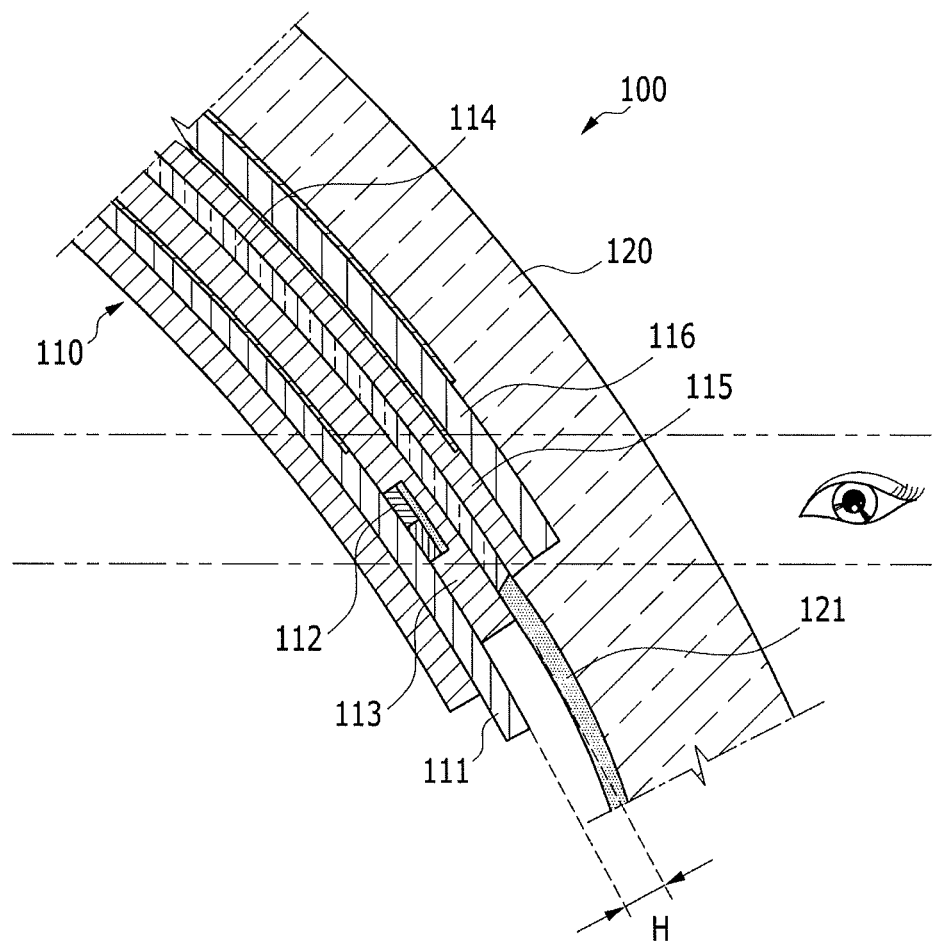
FIG. 2 illustrates a cross-sectional view of the display device according to an exemplary embodiment taken along line A-A' of FIG. 1.
Figure 3:
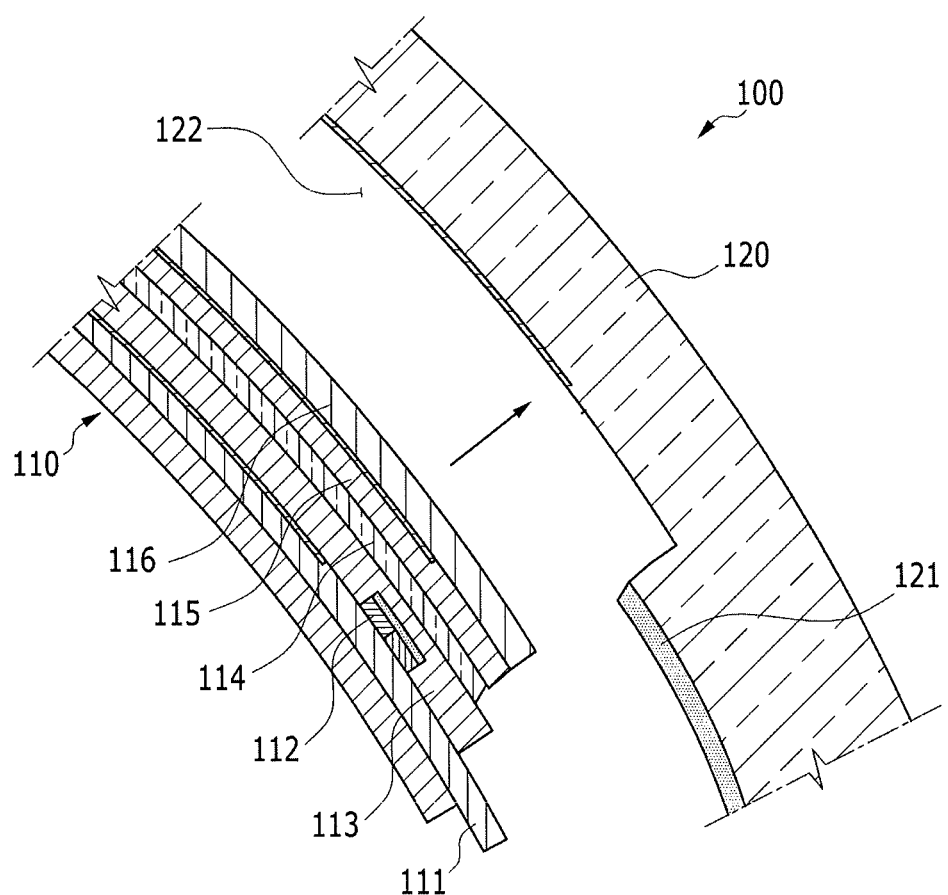
FIG. 3 illustrates a view of a state in which a curved window and a display unit are separated from each other in the display device according to an exemplary embodiment shown in FIG. 2.

FIG. 1 illustrates a perspective view of a display device according to an exemplary embodiment, FIG. 2 illustrates a cross-sectional view of the display device according to an exemplary embodiment taken along line A-A' of FIG. 1, and FIG. 3 illustrates a view of a state in which a curved window and a display unit are separated from each other in the display device according to an exemplary embodiment shown in FIG. 2.

Referring to FIGS. 1 to 3, the display device 100 according to an exemplary embodiment may include a flexible display unit 110 and a curved window 120.

An image may be displayed in the flexible display unit 110. The flexible display unit 110 may be made of a flexible material such as a plastic to maintain display performance even though it may be bent like a paper. The flexible display unit 110 may be bent in a shape corresponding to that of the curved window 120.

The curved window 120 may be positioned adjacent to one surface of the flexible display unit 110. The curved window 120 may have a predetermined curvature. A curvature of the curved window 120 may be freely changed depending on a design. The curved window 120 may be made of a transparent material, and the image display from the flexible display unit 110 may be irradiated to a user through the curved window.

The curved window 120 may protect the flexible display unit 110 from contact from the outside. The curved window 120 may be made of, for example, tempered glass. The curved window 120 may be made of reinforced plastic.

The curved window 120 may have a light blocking layer 121 disposed at one side thereof. The light blocking layer 121 may block regions other than regions in which the image may be displayed in the flexible display unit 110 so as not to be viewable to the user. The light blocking layer 121 may be made of one or more of, for example, carbon black, carbon nanotube(s), or chromium oxide ($CrO_2$).

The light blocking layer 121 may be made of a mixture of the above-mentioned material and, for example, resin. The light blocking layer 121 may be a black tape. In an embodiment, the light blocking layer 121 may include a material that blocks light.

In the display device 100 according to an exemplary embodiment including the curved window 120 and the flexible display unit 110, the curved window 120 may have a recess groove 122 formed therein. The recess groove 122 may be formed in a surface of the curved window 120 that the flexible display unit 110 contacts.

At least a portion of a part of the flexible display unit 110 contacting the curved window 120 may be accommodated in the recess groove 122. A portion of the flexible display unit 110 may be accommodated in the curved window 120, and the flexible display unit 110 and the light blocking layer 121 may be closer to each other. An effect generated by the structure as described above will be presented when a detailed structure of the flexible display unit 100 is described.

A detailed structure of the above-mentioned flexible display unit 110, the flexible display unit 110 may include, for example, a substrate 111, a polarizing plate 113, and a touch sensor 115.

A plurality of pixels 112 may be disposed on one surface of the substrate 111. The pixels 112 may be arranged in a matrix form. The pixel 112 may be configured of, e.g., include, a plurality of sub-pixels R, G, and B. In an embodiment, an arrangement of the sub-pixels configuring, e.g., included in, the pixel 112 may be changed depending on a design. For convenience of explanation, an embodiment in which the pixels 112 may be disposed on an upper surface of the substrate 111, and the image may be displayed upwardly from the substrate 111 will be described.

The polarizing plate 113 may be disposed on the substrate 111. The polarizing plate 113 may absorb some of external light and may polarize the remaining of the external light, and visibility of the external light may be improved. The polarizing plate 113 may convert an optical axis of light emitted to the outside. The polarizing plate 113 may have a structure in which transparent protecting films may be stacked on both surfaces or one surface of a polarizer made of a polyvinyl alcohol based resin.

The polarizing plate 113 may have a structure in which polyvinyl alcohol (hereinafter, referred to as PVA) based molecular chains may be aligned in a predetermined direction and a triacetyl cellulose (TAC) film may be bonded as a protecting film to a polarizer having a structure including an iodine based compound or a dichromatic polarization material. The polarizer and the protecting film may be bonded to each other by a resin based adhesive made of a polyvinyl alcohol based aqueous solution. In an embodiment, the polarizing plate 113 may have various structures.

The touch sensor 115 may be disposed on the polarizing plate 113. As the touch sensor 115, for example, a capacitive touch panel may be used. In an embodiment, the touch sensor 115 may be any touch panel that may recognize a touch of the user.

A first adhering layer 114 for attaching the touch sensor 115 and the polarizing plate 113 to each other may be formed between the touch sensor 115 and the polarizing plate 113 as described above. The first adhering layer 114 may be, for example, an optical transparent tape.

The touch sensor 115 may be accommodated in the recess groove 122 of the curved window 120. The touch sensor 115 may be attached to the curved window 120. A second adhering layer 116 may be formed between the touch sensor 115 and the curved window 120. The second adhering layer 116 may be, for example, an optical transparent tape.

The above-mentioned recess groove 122 may be recessed in a shape, e.g., the above-mentioned recess groove 122 may have a shape, corresponding to that of the touch sensor 115. The recess groove 122 may be formed having a size that is the same as or slightly larger than that of the touch sensor 115.

A distance H between the pixel 112 disposed on the substrate 111 and the light blocking layer 121 may be maximally decreased in a structure in which the touch sensor 115 is accommodated in the recess groove 122 of the curved window 120 as in the display device 100 according to an exemplary embodiment having the structure as described above, as compared with a structure in which the touch sensor is not accommodated in the curved window. Therefore, when the user views the display device 100 from a position slightly lower than a position corresponding to the front, e.g., from an off-center or non-orthogonal position, the pixel 112 may not be subjected to interference by the light blocking layer 121, and generation of color distortion, for example, due to interference of the light blocking layer 121 in at least one of the sub-pixels configuring the pixel 112, may be prevented.

Furthermore, in a process of manufacturing the display device 100 according to an exemplary embodiment, assembly may be performed in a state in which the flexible display unit 110 is seated in the recess groove 122 of the curved window 120. Therefore, a process of aligning the curved window 120 and the flexible display unit 110 with each other may not need to be additionally performed, and the assembly may be easily performed.

Figure 4:
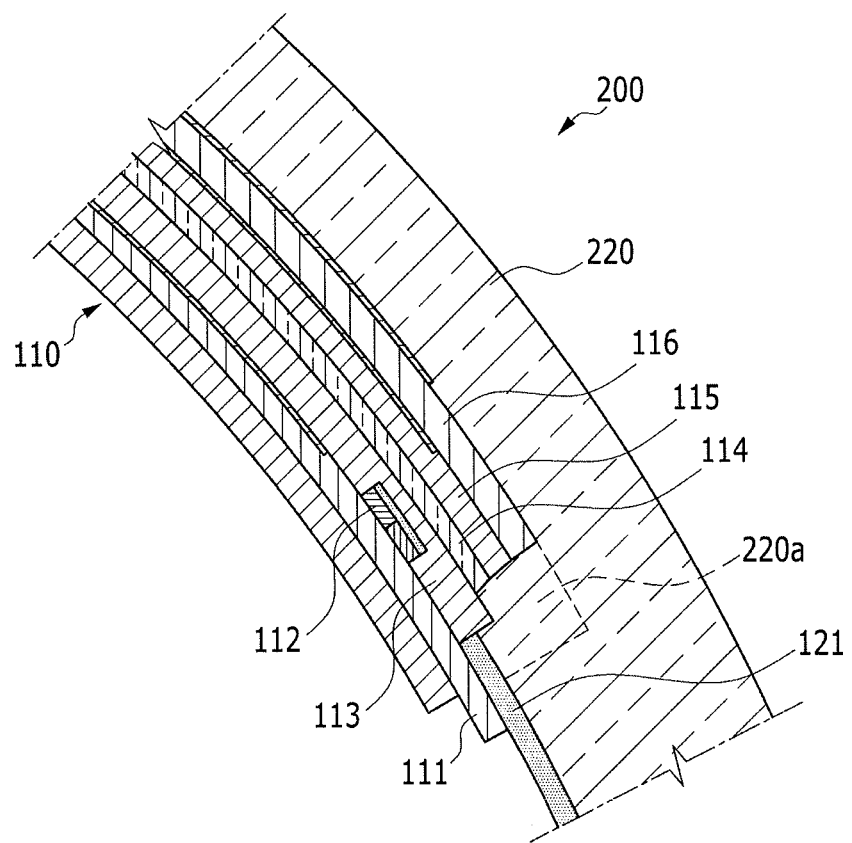
FIG. 4 illustrates a view of a display device according to an exemplary embodiment.

FIG. 4 illustrates a view of a display device according to an exemplary embodiment.

Referring to FIG. 4, in the display device 200 according to an exemplary embodiment, a polarizing plate 113 may be accommodated in a recess groove 122 of a curved window 220.

In the display device 100 (See FIG. 2) according to the above-mentioned exemplary embodiment, only the touch sensor 115 (See FIG. 2) may be accommodated in the recess groove 122 (See FIG. 2). In the display device 200 according to another exemplary embodiment, the polarizing plate 113 may also be accommodated together with the touch sensor 115 in the recess groove 122.

The polarizing plate 113 and the touch sensor 115 may be disposed in different sizes. For example, the polarizing plate 113 may be disposed in a size relatively larger than that of the touch sensor 115, and a portion 220a of an edge configuring the recess groove 122 in the curved window 220 may be formed in a multistage shape.

A distance between the pixel 112 disposed on the substrate 111 and the light blocking layer 121 may be further decreased by a thickness of the polarizing plate 113 in the display device 200 according to an exemplary embodiment having the structure as described above, as compared with the display device 100 (See FIG. 2) according to the above-mentioned exemplary embodiment. Therefore, reliability may be further improved in preventing color distortion.

Figure 5:
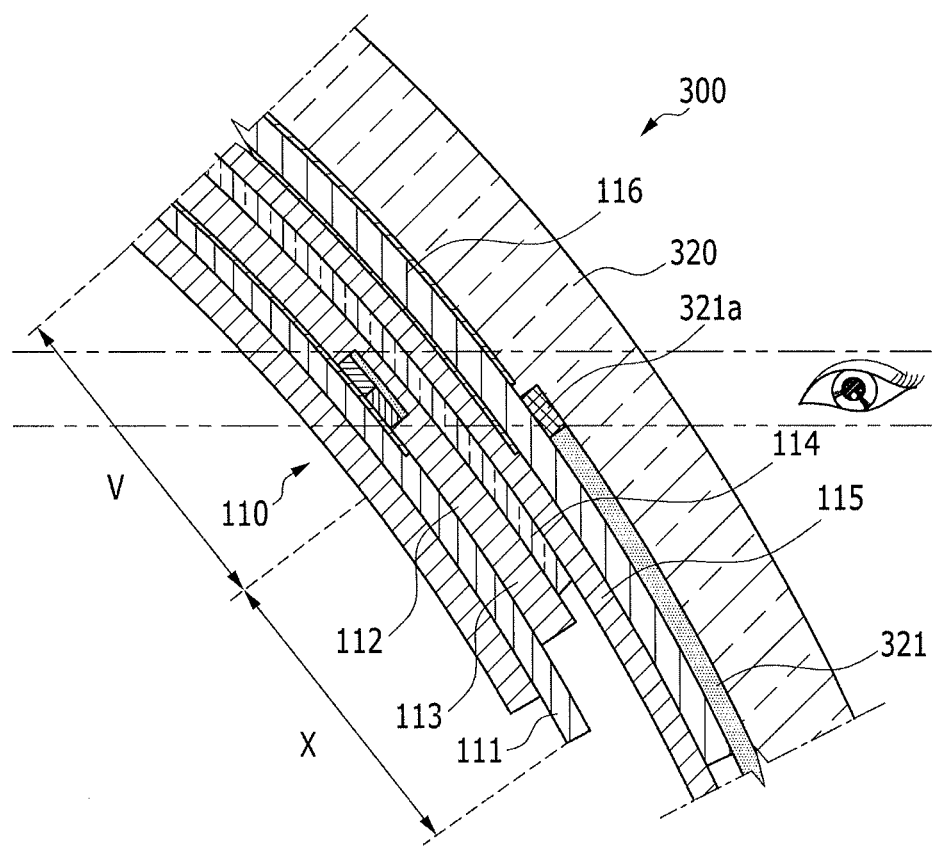
FIG. 5 illustrates a view of a display device according to an exemplary embodiment.
Figure 6:
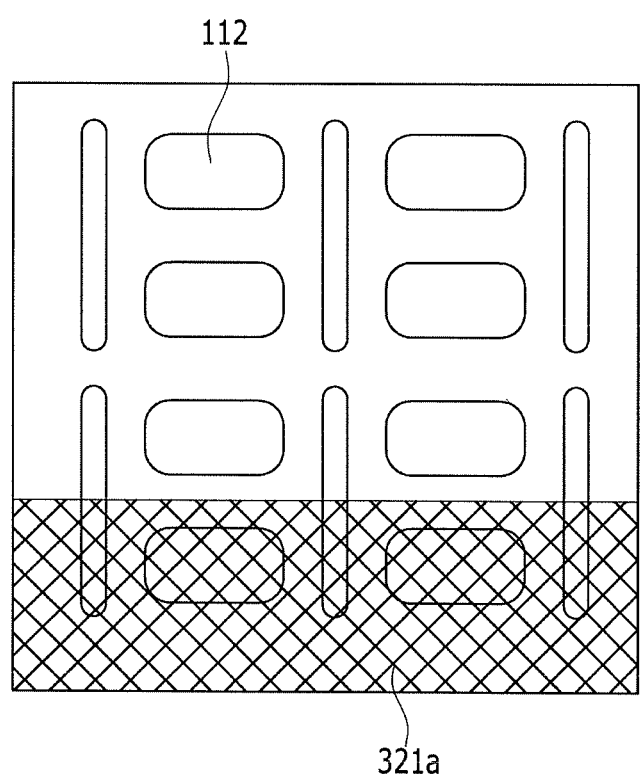
FIG. 6 illustrates an enlarged view of a portion of a light blocking layer and a pixel in the display device according to an exemplary embodiment shown in FIG. 5.

FIG. 5 illustrates a view of a display device according to an exemplary embodiment, and FIG. 6 illustrates an enlarged view of a portion of a light blocking layer and a pixel in the display device according to an exemplary embodiment shown in FIG. 5.

The display device 300 according to an exemplary embodiment may include a flexible display unit 110 and a curved window 320.

The display unit 110 may include a display area V and a non-display area X. The display area V may be a part of the substrate 111 on which a plurality of pixels 112 may be formed. The non-display area X may be a part of the substrate 111 on which the plurality of pixels 112 may not be formed. A scan driver and a data driver for driving the pixels 112 may be positioned in the non-display area X.

The curved window 320 may be positioned adjacent to one surface of the flexible display unit 110. The curved window 320 may have a predetermined curvature. The curved window 320 may not be provided with the recess groove 122 (See FIG. 2) unlike the curved window 120 included in the display device 100 (See FIG. 2) according to the above-mentioned exemplary embodiment.

The curved window 320 included in the display device 300 according to an exemplary embodiment may include a light blocking layer 321. The light blocking layer 321 may be disposed on a surface of the curved window 320 contacting the display unit 110, and may be formed in a portion corresponding to the non-display area X.

The light blocking layer 321 as described above may include a pattern part 321a. The pattern part 321a may include a plurality of holes formed in a pattern in an end portion of the light blocking layer 321 adjacent to the display area V. The pattern part 321a may be formed along, e.g., at, a portion of the curved window 320 corresponding to a boundary between the display area V and the non-display area X.

In the display device 300 according to an exemplary embodiment having the structure as described above, at least some of light irradiated by the sub-pixels configuring the pixel 112 may be transmitted to the outside by the pattern part 321a. Some of the sub-pixels configuring the pixel 112 may not be subjected to interference by the pattern part 321a, and a color mixed by the sub-pixels may be normally represented to the user without being distorted.

Figure 7:
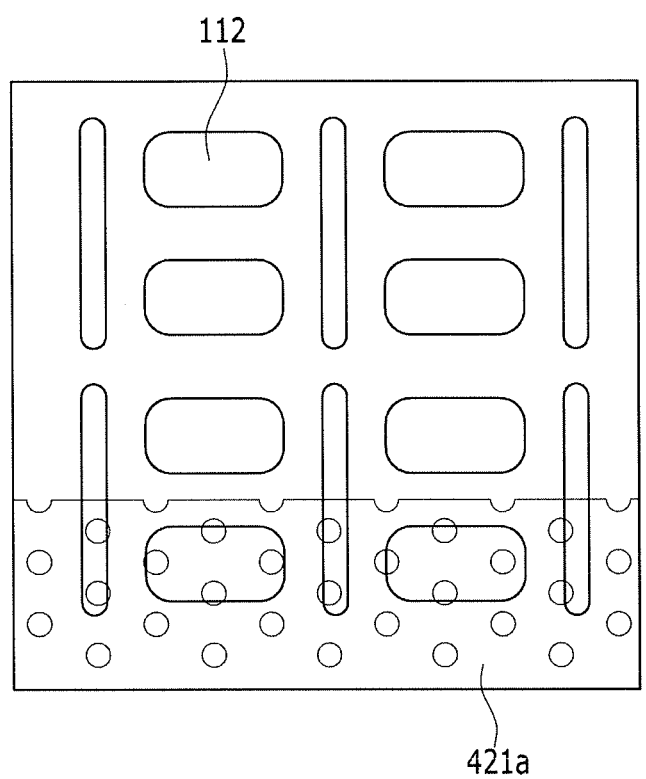
FIGS. 7 and 8 illustrate views of modified examples of the light blocking layer in the display device according to an exemplary embodiment shown in FIG. 5.
Figure 8:
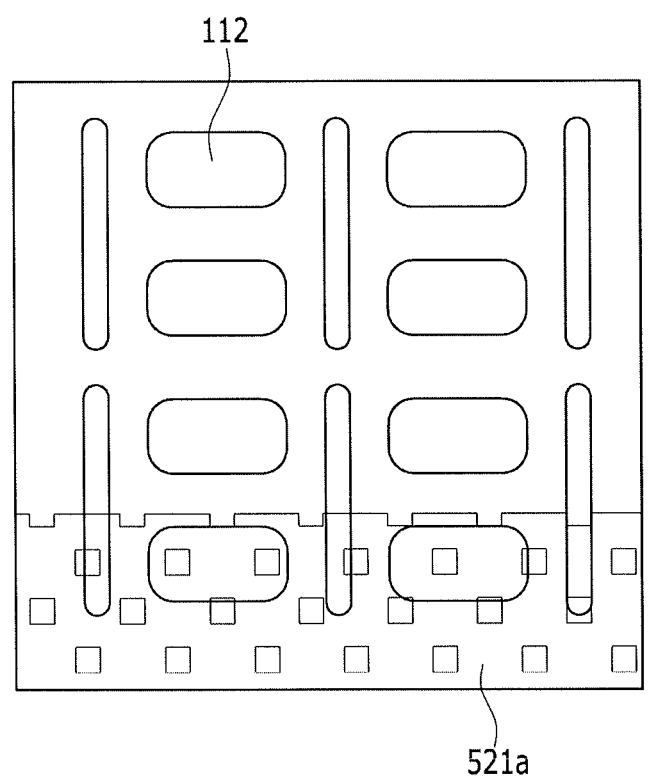

FIGS. 7 and 8 illustrate views of modified examples of the light blocking layer in the display device according to an exemplary embodiment shown in FIG. 5.

FIG. 7 illustrates a view of a light blocking layer in which circular holes are formed, and FIG. 8 illustrates a view of a light blocking layer in which quadrangular holes are formed.

As shown in FIG. 7, holes formed in a pattern part 421a may have a circular shape. In an embodiment, as shown in FIG. 8, holes formed in a pattern part 521a may have a quadrangular shape. In an embodiment, holes formed in a pattern part may have a line shape.

By way of summation and review, a user may wear and use a wearable portable terminal on a portion of his/her body. To improve wearability of the wearable portable terminal, the wearable portable terminal may be implemented in a bent shape, and a flexible display device having flexibility may be disposed on the bent wearable portable terminal.

A light blocking film may be disposed on a portion of a transparent window that may protect a panel in a portable terminal to prevent portions other than portions in which an image may be displayed in a display device from being viewed by the user. The light blocking film may have a black color and may be disposed along an edge of a bezel or may be disposed only in a portion of the edge of the bezel.

When the user views the portable terminal, in which the curved display device as described above is mounted, from the front, a pixel may not be subjected to interference by the light blocking film, and a color may be displayed to the user without being distorted. However, when the user views a lower portion of the portable terminal, one of several sub-pixels configuring the pixel may be subjected to interference by the light blocking film, only a color mixed by the other sub-pixels that may not be subjected to interference by the light blocking film may be irradiated to the user, and color distortion may be generated.

An exemplary embodiment provides a display device that may prevent generation of color distortion even though a user may not view the display device from the front.

A pixel disposed on a substrate may be closer to a light blocking layer in a structure in which a touch sensor may be accommodated in a recess groove of a curved window as in a display device according to an exemplary embodiment, as compared with a structure in which the touch sensor is not accommodated in the curved window. Therefore, when the user views the display device according to an exemplary embodiment from a position slightly lower than a position corresponding to the front, the pixel may not be subjected to interference by the light blocking layer, and generation of color distortion, for example, due to interference of the light blocking layer in some of sub-pixels configuring the pixel, may be prevented.

Furthermore, in a process of manufacturing the display device according to an exemplary embodiment, assembly may be performed in a state in which the flexible display unit may be seated in the recess groove of the curved window, a process of aligning the curved window and the flexible display unit with each other may not need to be additionally performed, and the assembly may be easily performed.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a flexible display; and
 a curved window having a bottom surface facing a top surface of the flexible display, the curved window having a predetermined curvature and having a recess groove accommodating at least a portion of the top surface of the flexible display, wherein:
 the bottom surface of the curved window includes a recess surface of the recess groove and a non-recess surface out of the recess groove, and
 a light blocking layer on the non-recess surface of the curved window is adjacent to a side wall of the flexible display in a horizontal direction.

2. The display device as claimed in claim 1, wherein the light blocking layer on the non-recess surface of the curved window abuts the side wall of the flexible display.

3. The display device as claimed in claim 1, wherein the flexible display includes:
 a substrate;
 a polarizing plate on the substrate; and
 a touch sensor on the polarizing plate,
 the touch sensor being in the recess groove of the curved window.

4. The display device as claimed in claim 3, wherein the polarizing plate is in the recess groove of the curved window.

5. The display device as claimed in claim 3, wherein the recess groove has a shape corresponding to that of the touch sensor.

6. A display device comprising:
 a flexible display including a display area and a non-display area, the flexible display having a plurality of pixels in the display area; and
 a curved window having a bottom surface facing a top surface of the flexible display, the curved window having a predetermined curvature,
 the curved window including a light blocking layer on a portion of the top surface of the flexible display corresponding to the non-display area,
 the light blocking layer including a pattern part having a plurality of holes in a pattern in an end portion of the light blocking layer adjacent to the display area, wherein
 the pattern part of the light blocking layer does not overlap the pluarlity of pixels in a vertical direction, and overlaps the pluarlity of pixels in a slanting direction.

7. The display device as claimed in claim 6, wherein the pattern part is along a portion of the curved window corresponding to a boundary between the display area and the non-display area.

8. The display device as claimed in claim 6, wherein the holes in the pattern part have a polygonal shape, a circular shape, or a line shape.

* * * * *